United States Patent

Yamamoto

[11] Patent Number: 5,498,966
[45] Date of Patent: Mar. 12, 1996

[54] INSPECTION DEVICE FOR INSPECTING CONTINUITY OF TERMINAL IN A CONNECTOR

[75] Inventor: Yoshikazu Yamamoto, Shizuoka, Japan

[73] Assignee: Yazaki Corporation, Japan

[21] Appl. No.: 43,771

[22] Filed: Apr. 6, 1993

[30] Foreign Application Priority Data

Apr. 7, 1992 [JP] Japan .................... 4-085532

[51] Int. Cl.⁶ .................................. G01R 31/02
[52] U.S. Cl. ........................................ 324/538
[58] Field of Search ............................ 324/538, 539, 324/66, 756, 757; 340/654

[56] References Cited

U.S. PATENT DOCUMENTS

| | | | |
|---|---|---|---|
| 2,668,618 | 2/1954 | Seelhoff | 324/538 |
| 3,296,494 | 1/1967 | Stenger, Jr. et al. | 324/538 |
| 3,617,876 | 11/1971 | Robinson | 324/539 |
| 4,232,262 | 11/1980 | Emo | 324/538 |
| 4,263,550 | 4/1981 | Schweitzer, Jr. | 324/538 |
| 4,902,968 | 2/1990 | Sugimoto | 324/538 |
| 5,231,357 | 7/1993 | Moody et al. | 324/538 |

FOREIGN PATENT DOCUMENTS

| | | | |
|---|---|---|---|
| 0354124 | 2/1990 | European Pat. Off. | 324/538 |
| 2169153 | 7/1986 | United Kingdom. | |
| 2200503 | 8/1988 | United Kingdom. | |
| 8905532 | 6/1989 | WIPO. | |

*Primary Examiner*—Maura K. Regan
*Attorney, Agent, or Firm*—Wigman, Cohen, Leitner & Myers

[57] ABSTRACT

An inspection device comprises a body having a connector insertion opening for inserting a connector into the device. The body holds a continuity inspector for inspecting the continuity of the terminals in contact relation therewith when the connector is inserted into the connector insertion opening. An arm member is supported by the body in turn free state. The arm member comprises an engaging portion for engaging and holding the connector inserted into the connector insertion opening. The inspection device further comprises a spring for forcing the arm member in the direction to engage the engaging portion with the connector and a solenoid for moving the arm member against the spring force of the spring in the direction to release the engagement of the engaging portion with the connector.

6 Claims, 5 Drawing Sheets

INSPECTION DEVICE FOR INSPECTING CONTINUITY OF TERMINAL IN A CONNECTOR

BACKGROUND OF THE INVENTION

This invention relates to an improvement of an inspection device for inspecting continuity of terminals in a connector.

Connectors are used to join two or more sections of the electrical wiring harness together to be installed into the body-work of a vehicle. Typical connectors have a terminal block in a connector housing where several terminals are grouped. The terminal block consists of either a row of male terminals or a row of female terminals. The connector may have a locking device to ensure a good attachment, and electrical connections between the male and female connectors will be achieved by means of firmly engaging them by the locking device. The escape of a terminal pin from the terminal block and poor continuity between terminals and wires are not allowable for the connector in use and such troubles should be avoided anyway.

With respect to this problem, to inspect terminals prior to installation is a reasonable and preferable counter-measurement. Various inspection devices for inspecting continuity of terminals have been developed for this purpose. For example, Japanese Utility Model Registration Examined Publication No. 8221/1980 and Japanese Patent Unexamined Prepublication No. 5383/1990 both disclose an inspection device for inspecting continuity of the terminals in a multi-pin connector. Wiring harness complexity, in a modern vehicle, requires the use of many of these multi-pin connectors having several terminals therein. The inspection device enables simultaneous inspection for mechanical connection and electrical connection, which is now described below.

Japanese Utility Model Registration Examined Publication No. 8221/1980 discloses the inspection device S as shown in FIGS. 1 and 2. FIG. 1 is a perspective view showing the inspection device of which sectional view is shown in FIG. 2. The inspection device S comprises a base plate 1, a holding plate 2, an inspector body 3 and a pair of cams 4. The holding plate 2 stands at a side of the base plate 1 and the inspector body 3 is slidably mounted on the base plate 1. The inspector body 3 moves on the base plate 1 by the cams 4 so as to approach and separate from the holding plate 2.

A connector catch 5 is formed on the holding plate 2 to receive a connector A to be inspected. The connector A has terminals 6 fitted to the end of wires 7 and the terminals 6 are held in a terminal accommodating chamber 11. The connector catch 5 is provided with an opening 5a through which the wires 7 are led to the outside. At the opposite side of the base plate 1 to the holding plate 2, a shaft fixture plate 15 is attached to fix a pair of slide shafts 8, 8. In this event, each slide shaft 8 is secured to the shaft fixture plate 15 at one ends thereof. The other end of the slide shaft 8 is supported by the holding plate 2. Each of the slide shafts 8, 8 penetrates through the inspector body 3 and compression coil springs 9 are wound in helical fashion around a portion of the slide shafts 8, 8, respectively, exposed to the outside of the inspector body 3. The compression coil springs 9 force the inspector body 3 to the fixture plate 15 in the direction apart from the connector catch 5.

The inspector body 3 consists of two inspector body blocks 3a and 3b which are formed together. An engaging hollow portion 10 is formed on the inspector body block 3b to engaging the connector A. The engaging hollow portion 10 faces to the connector catch 5 on the holding plate 2 and has a plurality of inspection pins 12 which are equal in number to the terminals 6 held in the terminal accommodating chamber 11 of the connector A. Each of the inspection pins 12 consists of a lead pin portion 12a and a tail pin portion 12b (see FIG. 2) passing through a penetration passage 13 formed in the inspector body 3.

The lead pin portion 12a passes through a compression coil spring 14 wound therearound. The compression coil spring 14 forces the lead pin portion 12a in the direction to the holding plate 2. Similarly, the tail pin portion 12b passes through a compression coil spring 16 wound therearound and is forced in the direction to the holding plate 2. The rear end of the lead pin portion 12a is not touched to the front end of the tail pin portion 12b when the connector A is not on inspection while the lead pin portion 12a contacts the tail pin portion 12b during continuity inspection of the terminals in a manner described below.

Cam catches 17 are formed on each side of the inspector body 3, where cam surfaces 4a, 4a of the cams 4 contact respectively.

Each of the cams 4 is rotatably supported by a pair of cam supporters 18, 18 through a shaft 19. The cams 4 are connected through an arm 20 which has a cam lever 20a projected from a central portion thereof. The cam lever 20a comprises a spherical knob at one end thereof, extremely away from the arm 20.

Inspection of continuity of the connector A by using the above mentioned inspection device S first requires to attach the connector A to the connector catch 5. Subsequently the arm 20 is moved along a sector track about the shaft 19, thereby the cams 4 slide on the cam catches 17 to push the inspector body 3 towards the connector A. As the inspector body 3 approaches the connector A, a front surface, facing to the inspector body 3, of the connector A gets into the engaging hollow portion 10. Each terminal pin 6 in the connector A abuts the lead pin portion 12a when the connector A engages the engaging concavity 10.

The inspector body 3 further approaches the connector A against the spring force of the compression coil springs 14 and 16 when the cam lever 20a is fully turned. As a result, the lead pin portion 12a is withdrawn in the inspector body 3 to contact the tail pin portion 12b. The inspection of continuity is made with the lead and tail pin portions 12a and 12b being in contact. After completion of the inspection of continuity, the connector A can be removed from the inspector body 3 by means of turning the arm 20 in the reverse direction. The facing surface of the connector A to the engaging hollow portion is away from the engaging hollow portion 10 due to the spring force of the compression coil spring 9. The terminals 6 are thus off the inspection pins 12 allowing picking the connector A out of the connector catch 5.

Next, an inspection device disclosed in Japanese Patent Unexamined Prepublication No. 5383/1990 is described with reference to FIGS. 3 and 4, where FIG. 3 shows a perspective view of the device while FIG. 4 shows a plan view thereof.

An inspection device P comprises an L-shaped base plate 21, an inspector body 22 and a cam 33. The L-shaped base plate 21 has a first holding plate 23 standing at one end thereof. The inspector body 22 is slidably mounted on the surface of the L-shaped base plate 21 and moved by means of the cam 33. The inspection device P further comprises a detector section 24 to detect incomplete attachment of a connector B to be inspected.

A first rectangular groove 23a is formed on the first holding plate 23 of the base plate 21, which the first groove 23a is similar in shape to a second groove 25a formed on a second holding plate 25 adjacent to the first holding plate 23. A pair of side-wall portions 26b and 26c are disposed on the surface of the second holding plate to form a third groove 26a of a connector catch 26 to receive the connector B.

The inspector body 22 is slidably supported by a pair of shaft 27, 27 as shown in FIG. 4. One end of each shaft 27 is attached to the side-wall portions 26b and 26c, respectively, and the other end thereof is attached to shaft fixture plates 28. Compression coil springs 29, 29 are wound around each shaft 27 in a similar manner as described in conjunction with FIGS. 1 and 2. The inspector body 22 is forced away from the side-wall portions 26b and 26c due to the spring force of the compression coil springs 29, 29. An engaging hollow portion 30 is formed on the surface of the inspector body 22 facing to the side-wall portions 26b and 26c to receive a front portion of the connector B. A plurality of inspection pins 31 are projected from the bottom of the engaging hollow portion 30 which are equal in number to the terminals (not shown) in the connector B. Each of the inspection pins 31 passes through a penetration passage (not shown) formed in the inspector body 22 and is forced toward the connector catch 26 by means of a spring member (not shown) such as a compression coil spring. A cam catch 32 is formed with the inspector body 22 at the side-wall thereof. A cam surface 41 of the cam 33 is urged and abutted to the cam catch 32 due to the spring force of the compression coil springs 29.

The cam 33 is rotatably supported by a cam fixture plate 34 standing on the base plate 21 and has a cam lever 35 extending from one end of the cam 33. To turn the cam lever 35 against the spring force of the compression coil springs 29 makes the inspector body 22 approach the connector catch 26. The detector section 24 is built at the diagonally opposite side of the base plate 21 to the cam 33.

The detector section 24 comprises a locking arm 38 and a connector presser bar 39. The locking arm 38 is rotatably supported by a pair of fixture plates 37 as shown in FIG. 3. The connector presser bar 39 contacts the rear end of the locking arm 38 and is arranged in the side-wall portion 26b in such a manner that it can be withdrawn in and projected from the surface of the side-wall portion 26b. More particularly, the connector presser bar 39 is projected into the third groove 26a when no connector is engaged with the connector catch 26 and a locking portion 40 of the locking arm 38 engages with the arm catch 36. On the other hand, the connector presser bar 39 is pushed away and withdrawn in the side-wall portion 26b when the connector B is completely inserted into the third groove 26a of the connector catch 26. In this event, the locking arm 38 is turned in the counter clockwise direction to release the engagement of the arm catch 36 and the locking portion 40.

Inspection of continuity of the connector B by using the above mentioned inspection device P first requires to attach the connector B to third groove 26a of the connector catch 26. Complete engagement of the connector B with the third groove 26a releases the locking portion 40 of the locking arm 38 from the arm catch 36. Subsequently, the cam lever 35 is turned against the spring force of the compression coil springs 29 to advance the inspector body 22 toward the connector B, following which the front portion of the connector B is inserted into the engaging hollow portion 30. When the front portion of the connector B is completely engaged with the engaging hollow portion 30, the inspection pins 31 contact the terminals in the connector B, respectively. The connector B and the inspection device P are thus ready for the inspection of continuity.

After completion of the inspection of continuity of the terminals, the cam lever 35 is turned in the reverse direction to remove the connector B from the inspector 22 with the spring force of the compression coil spring 29. The facing surface of the connector B to the engaging hollow portion 30 is away therefrom and the terminals are thus off the inspection pins 31 allowing picking the connector B out of the connector catch 26.

The above mentioned inspection devices accompany troublesome process to positively attach the connector to be inspected to the connector catch, to advance the inspector body until the communication between the inspection pins and terminals is completed, and to take the connector off the connector catch after completion of the inspection. Such multi-step process makes the inspection ineffective and time-consuming. In addition, the necessary connector catch on the base plate results in a large-scaled inspection device which can only be manufactured at a high cost.

SUMMARY OF THE INVENTION

An object of the present invention is to provide a small inspection device for inspecting continuity of terminals in a connector, which readily enables the inspection of the continuity of the terminals.

In order to achieve the above mentioned object, the present invention provides an inspection device for inspecting the continuity of the terminals fitted to the end of wires in a connector comprising a body having a connector insertion opening for inserting said connector therein; a continuity inspector held by said body for inspecting the continuity of said terminals in contact relation therewith when said connector is inserted into said connector insertion opening; a connector supporting member supported by said body, said connector supporting member including an engaging portion for engaging and holding said connector inserted into said connector insertion opening; first urging means for urging said connector supporting member in the direction to engage said engaging portion with said connector; and activating means for moving said connector supporting member against the spring force of said forcing means in the direction to release the engagement of said engaging portion with said connector.

According to the present invention, the connector is held in the connector insertion opening by means of engaging the connector supporting member with the connector after inserting the connector into the connector insertion opening. Removal of the connector from the connector insertion opening is achieved by activating the connector supporting member engaging with the back of the connector through the activating means.

DESCRIPTION OF THE PREFERRED EMBODIMENT

Figure 1:
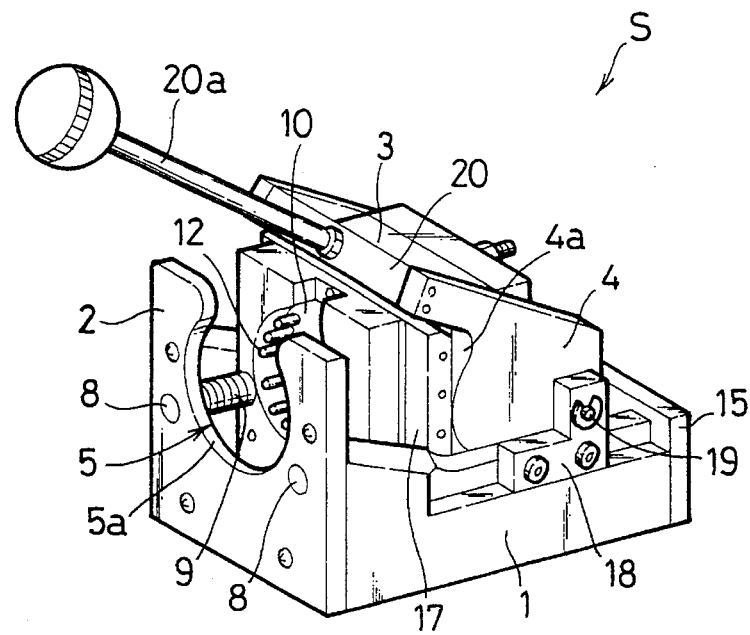
FIG. 1 is a perspective view of a conventional inspection device for inspecting continuity of terminals in a connector.
Figure 2:
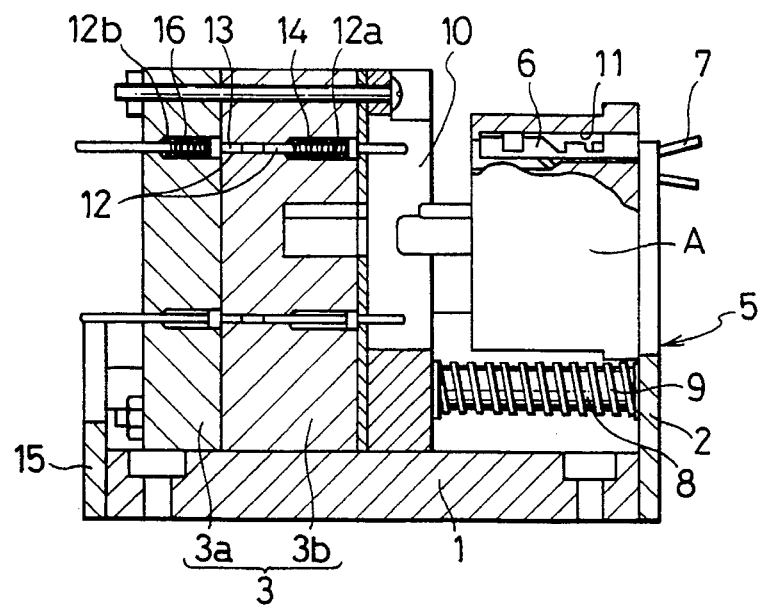
FIG. 2 is a sectional view of the inspection device illustrated in FIG. 1.
Figure 3:
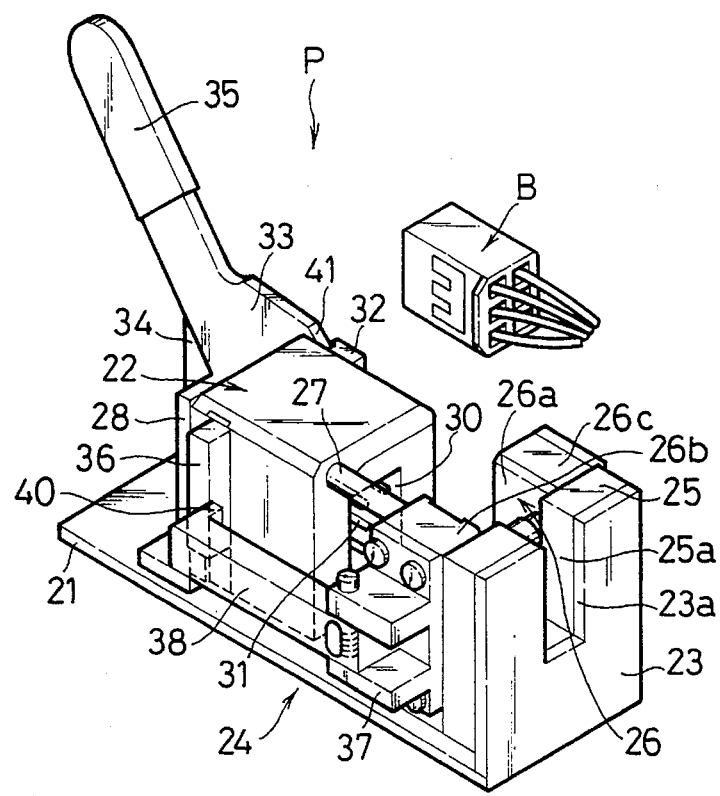
FIG. 3 is a perspective view of another conventional inspection device for inspecting continuity of terminals in a connector.
Figure 4:
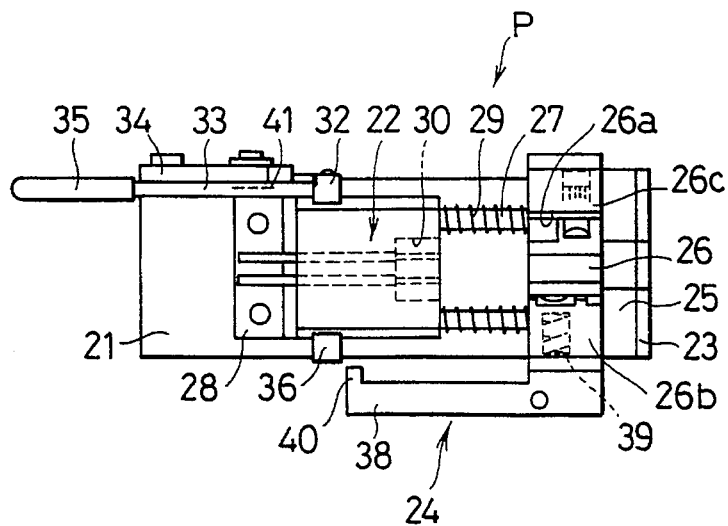
FIG. 4 is a plan view of the inspection device illustrated in FIG. 3.
Figure 5:
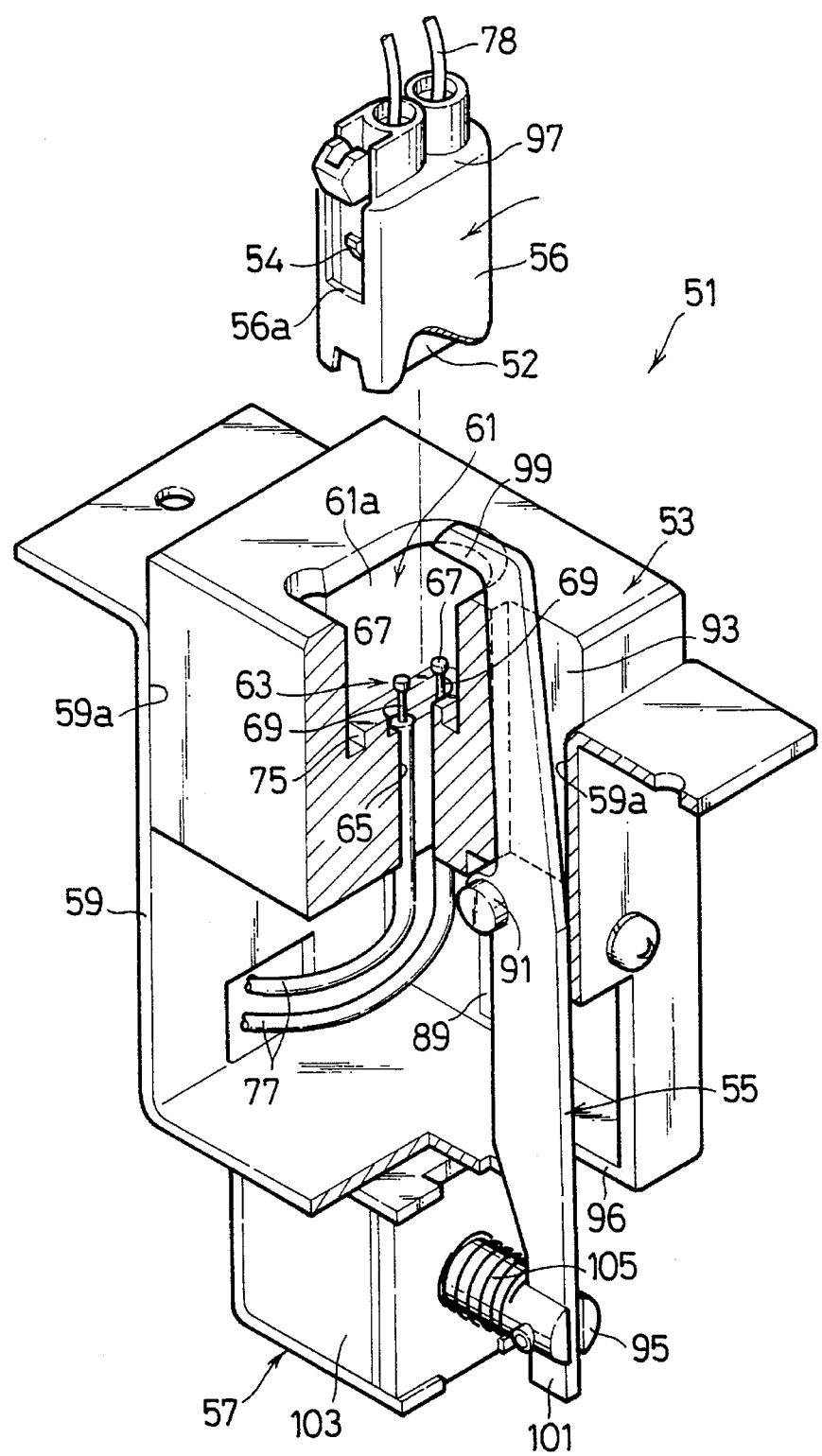
FIG. 5 is a partially cutaway perspective view of an inspection device for inspecting continuity of terminals in a connector according to an embodiment of the present invention.
Figure 6:
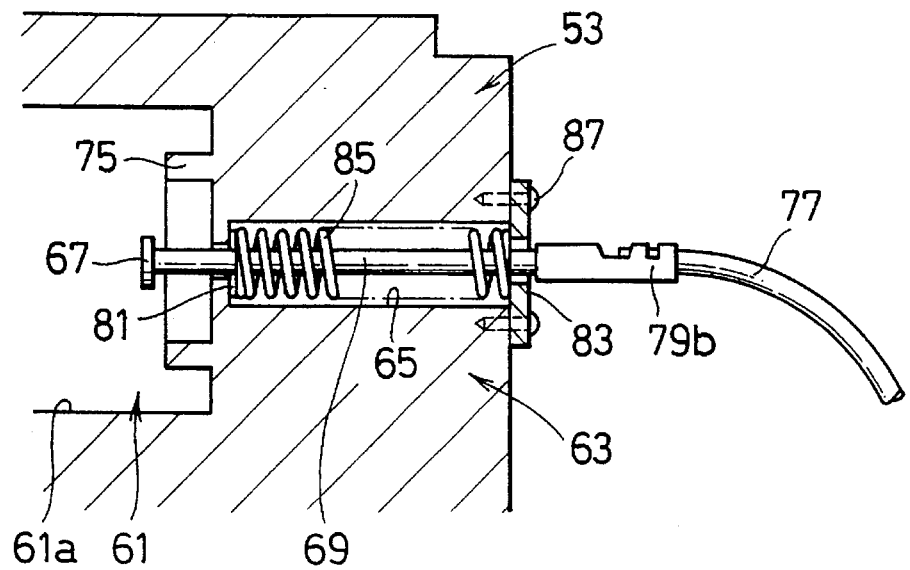
FIG. 6 is a sectional view of an inspector body of the inspection device illustrated in FIG. 5, in which no connector is inserted into a connector insertion opening.
Figure 7:
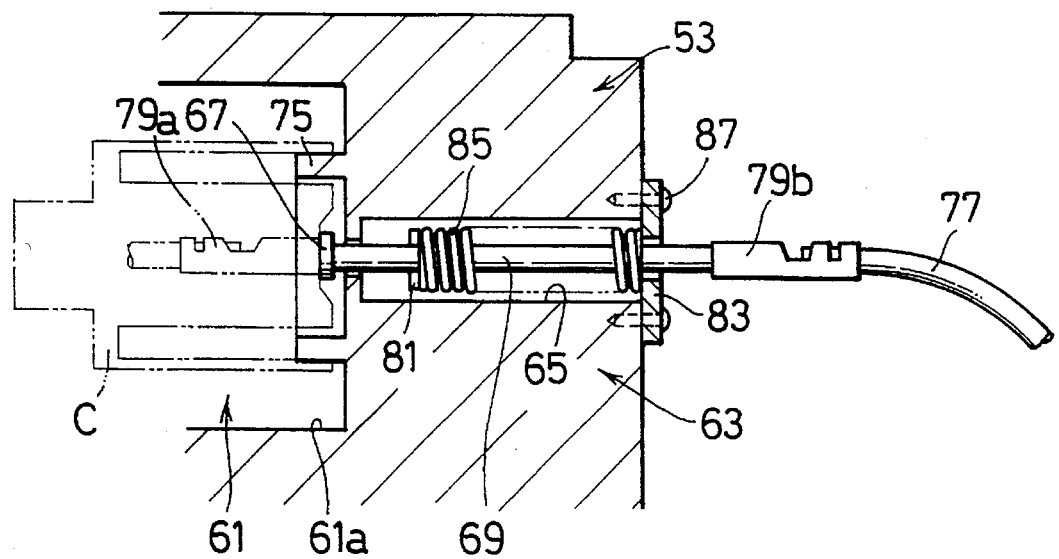
FIG. 7 is a sectional view of the inspector body illustrated in FIG. 6, in which the connector is inserted into the connector insertion opening and a continuity inspection pin abuts the terminal pin.

An embodiment of an inspection device for inspecting continuity of terminals in a connector according to the present invention is now described with reference to FIGS. 5 through 9. FIG. 5 shows a connector C of which continuity is to be inspected and an inspection device 51 for inspecting the continuity of the terminals in the connector C.

The connector C comprises a connector housing 52 and a cover 56 for covering the connector housing 52. The connector housing 52 comprises a terminal block (not shown) where the terminals 79a (see FIG. 7) are grouped. The terminal pin 79a is crimped to the end of the wires 78. The connector housing 52 has a locking projection 54 formed on one side thereof to be locked to a locking portion of the other of the connector pour. The locking projection 54 is exposed from a side opening 56a on the cover 56. The connector C is to be installed to the inspection device 51 to inspect the continuity of the terminals.

The inspection device 51 comprises an inspector body 53, a holding lever 55 and a solenoid 57, all of which are assembled with a holding plate 59. The inspector body 53 is for inspecting the continuity of the terminals 79a in the connector C. The holding lever 55 further comprises an engaging portion 99 at one end thereof to hold the connector C in the inspector body 53 by means of engaging the engaging portion 99 with the back of the connector C. The other end of the holding lever 55 is connected to the solenoid 57 and the holding lever 55 is activated thereby.

The holding plate 59 is formed in a U-shape and both ends thereof are bent at right angle in the opposite direction, away from each other. The inspector body 53 is held in an opening 59a formed between the bent ends of the holding plate 59 to extend slightly from the opening 59a. A connector insertion opening 61 is formed on the front surface (upper surface in FIG. 5) of the inspector body 53. The inside dimension of the connector accommodating chamber 61a measures slightly larger than the external size of the connector C. The connector C is to be inserted into the connector insertion opening 61 with the terminals 79a facing to the opening. When the connector C is completely inserted into the connector insertion opening 61, the rear end thereof remains out of the opening. A continuity inspector 63 is formed at the bottom of the connector insertion opening 61.

The continuity inspector 63 comprises a pair of continuity detecting pins 69 each of which has a disc-like detecting member 67 at one end thereof. The end of the continuity detecting pin 69 with the detecting member 67 protrudes from the inspector body into the connector accommodating chamber 61a. The middle portion of the continuity detecting pin 69 passes through a compression spring 85 in a penetration passage 65 formed in the inspector body 53 while the tail end of the pin 69 is protruded from the inspector body 53 towards the solenoid 57. The tail end of the pin 69 is attached to a terminal 79b which is crimped to the end of the wire 77.

A pin stopper 81 is formed on the middle portion of each continuity detecting pin 69 at a portion nearer to the connector insertion opening 61. The pin stopper 81 is formed in a manner normal to the continuity detecting pin 69. A spring stopper 83 is threadedly secured to the inspector body 53 over the penetration passage 65 by means of screws 87. The compression coil spring 85 is disposed between the pin stopper 81 and the spring stopper 83. The connector C, when inserted into the connector insertion opening 61 and held by the holding lever 55, is forced in the direction out of the opening 61 by the spring force of the compression coil spring 85.

A peripheral wall 75 is formed around the continuity detecting pins 69 and is inserted between the connector housing 52 and the cover 56 of the connector C when the connector C is completely attached to the inspection device 51.

The holding lever 55 is rotatably supported by a lever supporting plate 89 through a rotary shaft 91. One end of the holding lever 55 is projected into the connector insertion opening 61, passing through a concavity 93 formed in the inspector body 53. The projected end is bent at an approximate right angle to form the engaging portion 99. The engaging portion 99 engages a back 97 of the connector C inserted into the connector insertion opening 61. The other end 101 of the holding lever 55 is rotatably connected to a driving shaft 95 of the solenoid 57, passing through a rectangular penetration passage 96 formed on the holding plate 59.

The solenoid 57 comprises a solenoid body 103 and the driving shaft 95 inserted into the solenoid body 103 which is secured to the external surface of the bottom of the U-shape of the holding plate 59. When the solenoid body 103 is not energized the driving shaft 95 is protruded from the solenoid body 103 due to the spring force of a compression coil spring 105 wound around the driving shaft 95. On the contrary, the driving shaft 95 is withdrawn in the solenoid body 103 when it is energized.

Figure 8:
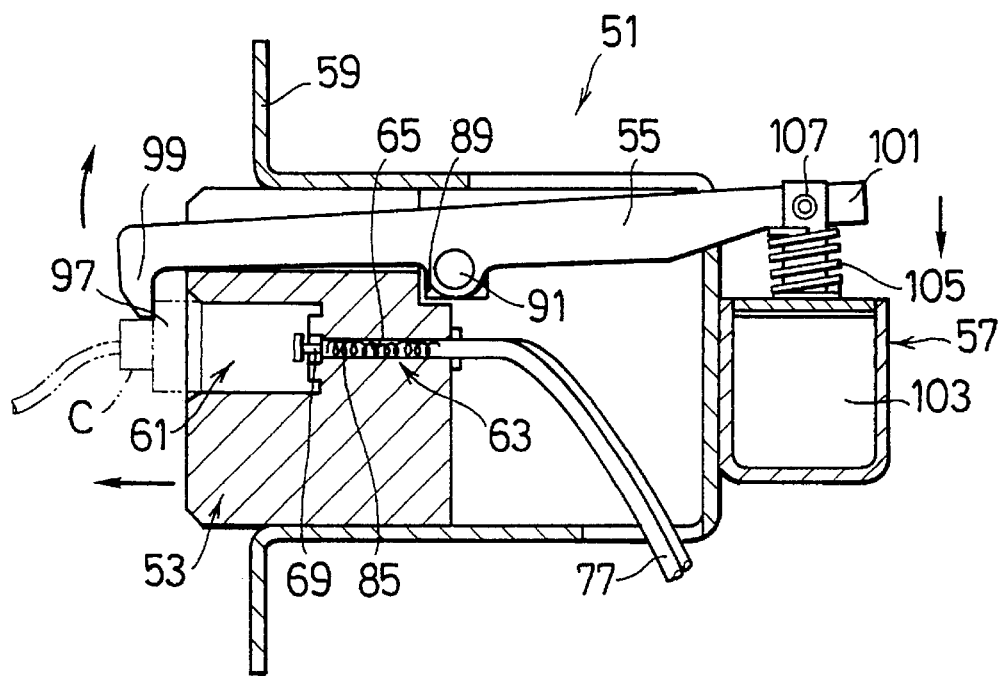
FIG. 8 is a sectional view of a part of the inspection device illustrated in FIG. 5, in which a holding lever holds the connector.
Figure 9:
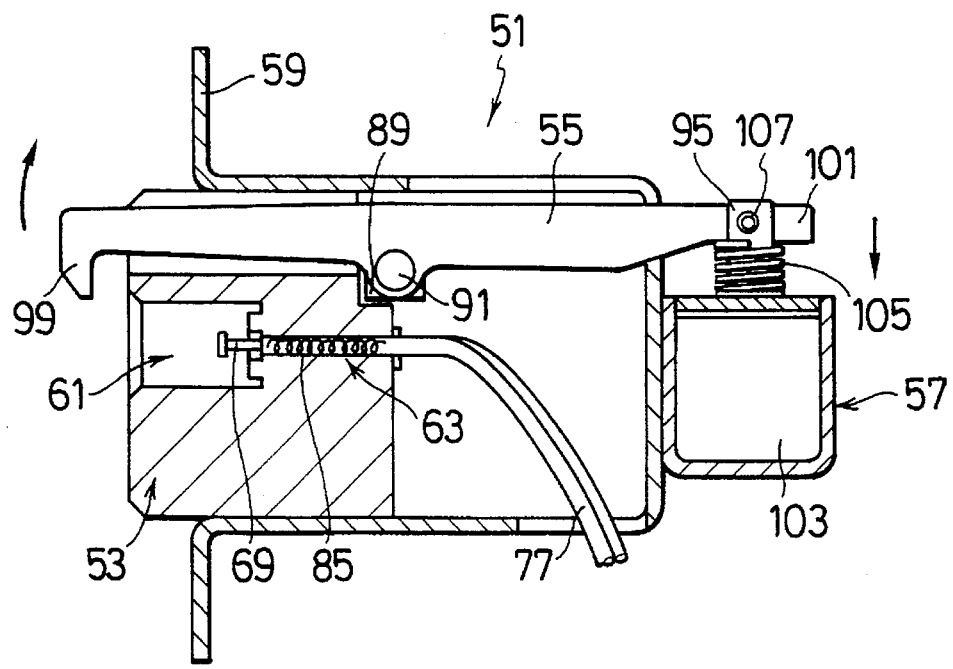
FIG. 9 is a sectional view similar to FIG. 8, in which the holding lever is turned by means of a solenoid.

The above mentioned inspection device 51 is used to inspect the continuity of the terminals in the connector C, a method and operation therefor are described below. It is noted that the solenoid 57 of the inspection device 51 is initially unenergized and the driving shaft 95 is lowered from the solenoid body 103 due to the spring force of the compression coil spring 105 as shown in FIG. 8. The engaging portion 99 is projected into a passage to insert the connector C into the connector insertion opening 61.

When the connector C is inserted into the connector insertion opening 61, the terminals 79a in the connector C contacts with the corresponding detecting members 67 of the continuity detecting pins 69. The connector C is further inserted into the connector insertion opening 61 up to the bottom thereof against the spring force of the compression coil spring 85. As a result of insertion of the connector, the holding lever 55 is moved in the clockwise direction against the spring force of the compression coil spring 105. In this event, the engaging portion 99 of the holding lever 55 slides on the side of the connector C. When the connector C is completely inserted into the connector insertion opening 61, the holding lever 55 moves in the counter clockwise direction due to the spring force of the compression coil spring 105 and the engaging portion 99 engages with the back surface 97 of the connector C. The connector C is held in the connector insertion opening 61 and ready for the inspection of continuity of the terminals 79a. The inspection of continuity is made by energizing the continuity detecting pins 69.

After completion of the inspection of continuity of the terminals 79a, the holding lever 55 is moved in the clockwise direction with the driving shaft 95 withdrawn in the solenoid body 103 by means of energizing the solenoid 57. As a result, the engaging portion 99 of the holding lever 55 is out of engagement with the back 97 of the connector C. The connector C is then pushed away from the connector insertion opening 61 due to the spring force of the compression coil springs 85.

According to the present embodiment, the connector C can be fitted to the continuity inspector 63 only by inserting the connector C into the connector insertion opening 61. In addition, it is possible to remove the connector C from connector insertion opening 61 by merely activating the solenoid 57. This results in improved efficiency of the inspection of continuity.

When a plurality of inspection devices 51 are gathered as an inspection device assembly for the wiring harness, it is possible to remove a plurality of connectors C from the connector insertion openings 61 at one time by means of simultaneous activation of the solenoid 57, which results in improved efficiency of the continuity inspection.

In addition, the inspection device according to the present invention requires no connector catch, which is necessary for the conventional inspection device. As a result, it is possible to provide the inspection device of more simple structure manufactured at less cost.

While the above mentioned invention has thus been described in conjunction with the preferred embodiment thereof, it is readily understood by those skilled in the art that various modifications can be made without departing from the spirit and scope of the present invention. For example, conventional detection means can be applied to the present invention to detect incomplete insertion of the connector into the connector insertion opening.

The detection member 67 formed at the end of the continuity detection pin 69 may be formed in any shape other than the disc.

The holding lever 55 is activated by the solenoid in the above mentioned embodiment, which may be activated by other activating means.

The compression coil spring 85 is wound around the continuity detection pin 69 though other elastic member or a spring may be equally applied to the present invention as an alternation of the compression coil spring 85. In addition, the compression coil spring 85 or other forcing means can be separately disposed from the continuity detection pin 69 instead of wounding it around the pin.

The holding lever 55 for holding the connector may be substituted by other means. For example, a driving shaft for the solenoid may have an engaging pawl to engage with the connector.

In addition, while the above mentioned embodiment discloses the holding lever 55 activated through the solenoid 57 which serves as activating means, it may be possible to integrally form an engaging portion with the activating means.

The holding lever 55 engages the back surface 97 of the connector, which may be any one of a depressing portion, protruding portion and grooves formed on the connector.

What is claimed is:

1. An inspection device for inspecting continuity of terminals connected to ends of wires in a connector comprising:

a body having a connector insertion opening for inserting said connector therein;

a continuity inspector held by said body for inspecting the continuity of said terminals in contact relation therewith when said connector is inserted into said connector insertion opening, said continuity inspector including continuity detecting members which are slidably supported by said body and which have disk-like ends to be brought into contact with respective ones of said terminals of the connector;

a connector retaining member supported along a length dimension thereof by said body, said connector retaining member including at a first end thereof an engaging portion for engaging and holding said connector when said connector is present in said connector insertion opening such that said terminals press against said disk-like ends of said continuity detecting members;

first urging means for urging said connector retaining member in the direction to engage said engaging portion with said connector;

second urging means for urging said continuity detecting members toward said terminals, and activating means for moving said connector retaining member at a second end thereof against the urging force of said first urging means in the direction to release the engagement of said engaging portion with said connector, after inspecting the continuity of said terminals;

whereby said connector after inspection is discharged from said connector opening by an urging force of said second urging means.

2. An inspection device according to claim 1, wherein said second urging means includes a compression spring.

3. An inspection device according to claim 1, wherein said connector insertion opening includes an accommodating chamber adapted for receiving said connector, said connector includes a proximal end and a distal end, and said accommodating chamber is recessed to maintain the distal end of said connector outside thereof when said connector is inserted into said connector insertion opening.

4. An inspection device according to claim 1, wherein said connector retaining member is pivotably supported at the central portion thereof.

5. An inspection device according to claim 4, wherein said first urging means includes a compression spring for urging said second end of said connector retaining member, and said activating means includes a solenoid for moving said second end of said connector retaining member against the spring force of said compression spring.

6. An inspection device according to claim 4, wherein said first end has a slanted face converging in the direction to insert said connector into said connector insertion opening, thereby facilitating the insertion of said connector thereinto.

* * * * *